United States Patent
Yu et al.

(10) Patent No.: US 10,707,290 B2
(45) Date of Patent: Jul. 7, 2020

(54) FLEXIBLE DISPLAY PANEL HAVING CONCAVE AREA AND FLEXIBLE DISPLAY DEVICE INCLUDING THE FLEXIBLE DISPLAY PANEL

(71) Applicant: SHANGHAI TIANMA MICRO-ELECTRONICS CO., LTD., Shanghai (CN)

(72) Inventors: Quanpeng Yu, Shanghai (CN); Wenxin Jiang, Shanghai (CN); Chuanli Leng, Shanghai (CN); Zhenying Li, Shanghai (CN); Xilie Li, Shanghai (CN); Zhe Li, Shanghai (CN); Conghui Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/191,436

(22) Filed: Nov. 15, 2018

(65) Prior Publication Data
US 2019/0081128 A1 Mar. 14, 2019

(30) Foreign Application Priority Data
Mar. 29, 2018 (CN) .......................... 2018 1 0269564

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2251/5338* (2013.01)

(58) Field of Classification Search
CPC ............ H01L 27/3276; H01L 51/0097; H01L 2251/5338; G09F 9/301
See application file for complete search history.

(56) References Cited

U.S. PATENT DOCUMENTS

| | | | | |
|---|---|---|---|---|
| 2014/0254111 A1* | 9/2014 | Yamazaki | ........... | H01L 27/3276 361/749 |
| 2014/0307003 A1* | 10/2014 | Choi | .................... | G09G 3/3648 345/690 |
| 2016/0179229 A1* | 6/2016 | Ahn | ........................ | G06F 3/041 345/173 |

FOREIGN PATENT DOCUMENTS

CN 104992956 A 10/2015

* cited by examiner

*Primary Examiner* — Laura M Menz
*Assistant Examiner* — Candice Chan
(74) *Attorney, Agent, or Firm* — Kilpatrick Townsend & Stockton, LLP

(57) ABSTRACT

Provided are a flexible display panel and a flexible display device, in which a non-display area surrounds a display area. A concave area protrudes along a direction away from interior of display area. A convex area has a folding axis parallel to a first edge. The non-display area includes a fan-out area, in which lead wires are provided. Each lead wire has a first end and a second end. There are signal traces each extending along a first direction provided in display area. The signal traces are electrically connected to first ends of lead wires. The convex area and concave area are arranged along a second direction. The second direction intersects first direction. A driving chip is included, which is a ball grid array package driving chip and is arranged in concave area where lead wires are away from first edge and electrically connected to second ends of lead wires.

20 Claims, 13 Drawing Sheets

FLEXIBLE DISPLAY PANEL HAVING CONCAVE AREA AND FLEXIBLE DISPLAY DEVICE INCLUDING THE FLEXIBLE DISPLAY PANEL

CROSS-REFERENCE TO RELATED APPLICATIONS

The present application claims priority to Chinese Patent Application No. 201810269564.3, filed on Mar. 29, 2018, the content of which is incorporated herein by reference in its entirety.

FIELD

The present disclosure relates to the field of flexible display technologies and, more particularly, to a flexible display panel and a flexible display device.

BACKGROUND

With the development of display technologies, portable devices have become a new developing trend in modern society, and are gradually changing human life and bringing a great revolution to science and technology. In particular, a flexible display panel, which is foldable, portable and can be used in a wide range, is becoming more and more popular, and allows a user to have an entirely new watching experience. More particularly, the flexible display panel provides more possibility for achieving full-screen display.

SUMMARY

The present disclosure provides a flexible display panel and a flexible display device.

In one embodiment, the present disclosure provides a flexible display panel. The flexible display panel is divided into a display area and a non-display area surrounding the display area. The non-display area includes a fan-out area. The flexible display panel includes signal traces provided in the display area, the signal traces extending along a first direction; a first edge concaving toward an interior of the display area to form, on the flexible display panel, at least one concave area and at least one convex area adjacent to the at least one concave area, and the at least one convex area protrudes along a direction away from the interior of the display area, the at least one convex area and the at least one concave area are arranged along a second direction, and the second direction intersects the first direction; a reflexed area, the reflexed area having a folding axis parallel to the first edge, the at least one convex area; lead wires provided in the fan-out area, and each lead wire of the plurality of lead wires comprises a first end and a second end, and the plurality of signal traces is electrically connected to the first ends of the plurality of lead wires; and a driving chip arranged in the reflexed area, and the driving chip is electrically connected to the second ends of the plurality of lead wires, and the driving chip is a ball grid array package driving chip.

In another embodiment, the present disclosure provides a flexible display device, which includes a flexible display panel. The flexible display panel is divided into a display area and a non-display area surrounding the display area. The non-display area includes a fan-out area. The flexible display panel includes: signal traces provided in the display area, the plurality of signal traces extending along a first direction; a first edge concaving toward an interior of the display area to form, on the flexible display panel, at least one concave area and at least one convex area adjacent to the at least one concave area, and the at least one convex area protrudes along a direction away from the interior of the display area, the at least one convex area and the at least one concave area are arranged along a second direction, and the second direction intersects the first direction; a reflexed area, the reflexed area having a folding axis parallel to the first edge, the at least one convex area; lead wires provided in the fan-out area, and each lead wire of the plurality of lead wires comprises a first end and a second end, and the plurality of signal traces is electrically connected to the first ends of the plurality of lead wires; and a driving chip arranged in the reflexed area, and the driving chip is electrically connected to the second ends of the plurality of lead wires, and the driving chip is a ball grid array package driving chip.

BRIEF DESCRIPTION OF DRAWINGS

The following accompanying drawings are incorporated into the description and constitute a part of the description to illustrate embodiments of the present disclosure and explain the principles of the present disclosure together with the descriptions thereof.

DESCRIPTION OF EMBODIMENTS

Now the accompanying drawings are referred to describe the illustrative embodiments of the present disclosure in detail. It should be noted that relative arrangements, numerical expressions and values related to components and steps illustrated in these embodiments are not intended to limit the present disclosure, unless otherwise noted.

The following description of at least one embodiment is merely illustrative but not used as limitation to the present disclosure or use or application thereof.

In the embodiments shown and discussed herein, any value shall be viewed as exemplary instead of limitation. That is, the value may be different in some other embodiments.

It should be noted that similar symbols and letters represents similar items in the following context. Therefore, once an item is defined in one figure, the item will not be further defined in the subsequent figures.

Figure 1:
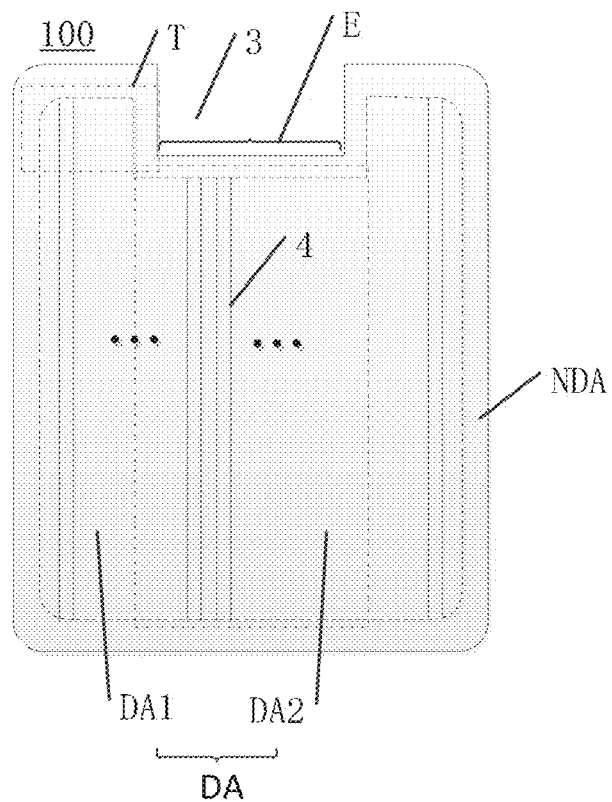
FIG. 1 is a schematic diagram showing a planar structure of a flexible display panel according to an embodiment of the present disclosure.
Figure 2:
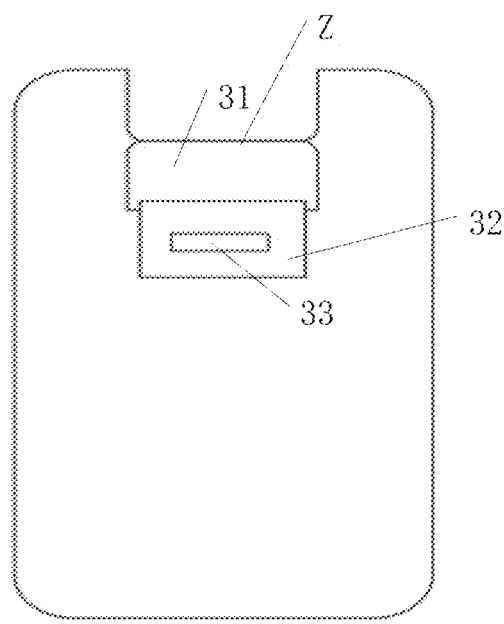
FIG. 2 is a rear view of the flexible display panel provided in FIG. 1.
Figure 3:
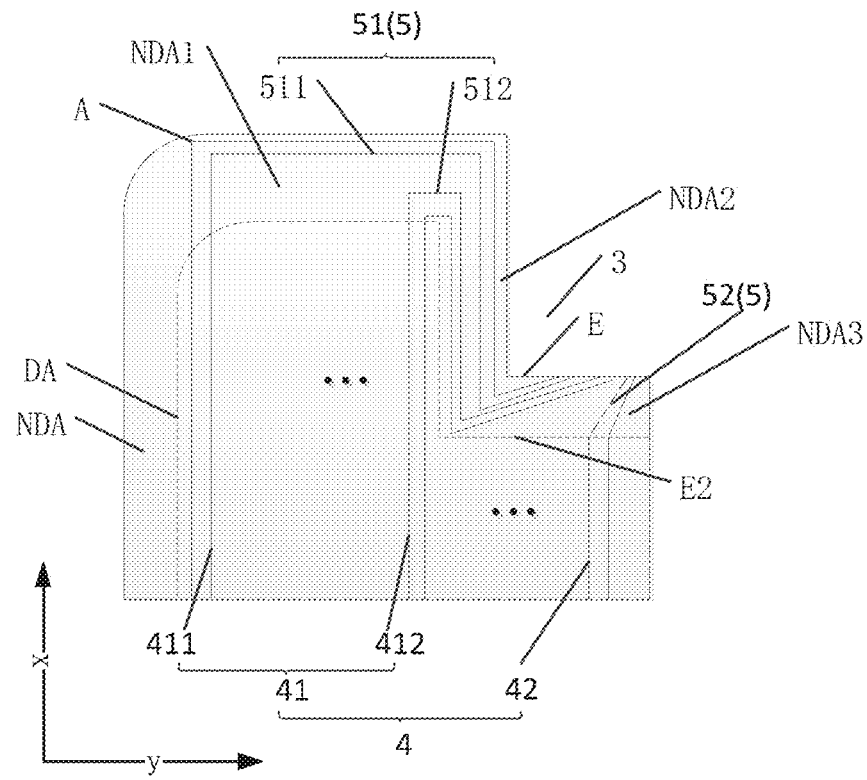
FIG. 3 is a schematic diagram showing a local planar structure of the flexible display panel provided in FIG. 1.
Figure 4:
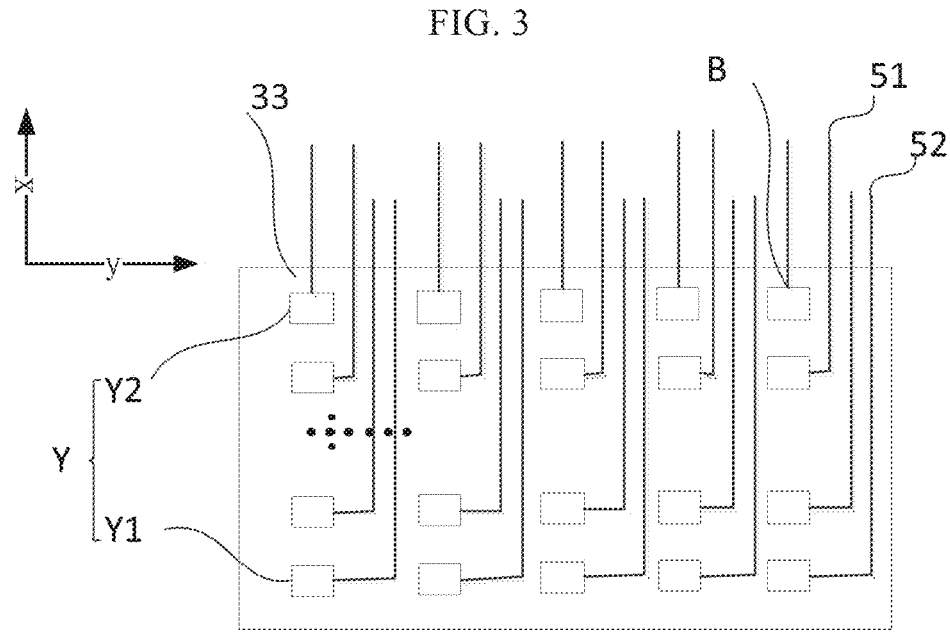
FIG. 4 is a schematic diagram of pins of a driving chip according to an embodiment of the present disclosure.

Please refer to FIGS. 1-4. FIG. 1 is a schematic diagram showing a planar structure of a flexible display panel according to an embodiment of the present disclosure; FIG. 2 is a rear view of the flexible display panel provided in FIG. 1; FIG. 3 is a schematic diagram showing a local planar structure of the flexible display panel provided in FIG. 1; and FIG. 4 is a schematic diagram of pins of a driving chip according to an embodiment of the present disclosure. The flexible display panel includes: a display area DA and a non-display area NDA surrounding the display area DA. The flexible display panel 100 includes a first edge E, which concaves toward an interior of the display area DA to form at least one concave area 3 and at least one convex area T adjacent to the at least one concave area 3. The convex area T protrudes along a direction away from the interior of the display area DA. The non-display area NDA includes a fan-out area. There are signal traces 4 extending along a first direction X provided in the display area DA, and there are lead wires 5 provided in the fan-out area. Each of the plurality of lead wires 5 includes a first end A and a second end B. The plurality of signal traces 4 is electrically connected to first ends A of the plurality of lead wires 5. The at least one convex area T and the at least one concave area 3 are arranged along a second direction Y, and the second direction intersects the first direction. The flexible display panel 100 further includes a reflexed area 31. The reflexed area 31 has a folding axis Z parallel to the first edge E. The reflexed area 31 can be bent to a back surface of the flexible display panel 100 about the folding axis Z. That is, when the flexible display panel 100 has its respective areas located in a same plane, the convex area T and the reflexed area 31 are arranged along the second direction Y but are not connected with each other. The reflexed area 31 is connected to other areas of the flexible display panel 100 in the first direction X, and the corresponding connection occurs at the folding axis Z. When the reflexed area 31 is bent to the back surface of the flexible display panel 100 about the folding axis Z, the folding axis Z becomes a part of the first edge E. The flexible display panel further includes a driving chip 33 arranged in the reflexed area 31 (in another embodiment, this may be arranged on a side of the reflexed area far away from the first edge E), and the driving chip 33 is electrically connected to second ends B of the plurality of lead wires 5. The driving chip 33 is a ball grid array package driving chip. According to an embodiment, the reflexed area 31 can be set in such a manner that the reflexed area 31 can be bent to a back surface of the flexible display panel 100 about the folding axis Z and the plurality of lead wire 5 is electrically connected to the driving chip 33 located in the reflexed area 31 by the fan-out area. Compared with the related art, there is no need to arrange an additional invalid area at the bottom of the display area DA for the placement of the driving chip, so that a border occupied by the lead wires 5 can be effectively reduced to realize a narrow border. In addition, compared with a pin attachment package driving chip, the ball grid array package driving chip adopted by the present disclosure has a large amount of pins, which are firmly fixed so that no deformation of the pins will occur and which are short so that signal paths are short, thereby reducing inductance and capacitance of the lead wires and enhancing electrical properties, and the ball grid array package driving chip adopted by the present disclosure has good heat dissipation performance. In the present disclosure, the ball grid array package driving chip is applied to the concave area 3, which can effectively reduce a width of the concave area 3 such that the concave area with a small width can realize an electrical connection between the signal lead wires and the driving chip. Therefore, an area of the non-display area can be sufficiently reduced so as to achieve the full-screen display. According to an embodiment shown in FIG. 1 and FIG. 3, the display area DA includes a first display area DA1 and a second display area DA2, the first display area DA1 includes a part of the display area located in the convex area T, and the second display area DA2 does not include the part of the display area located in the convex area T and is adjacent to the first edge E. There are first signal traces 41 provided in the first display area DA1, and there are first lead wires 51 electrically connected to the first signal traces 41 provided in the fan-out area; there are second signal traces 42 provided in the second display area DA2, and there are second lead wires 52 electrically connected to the second signal traces 42 provided in the fan-out area; the non-display area NDA includes: a first non-display area NDA1 which is adjacent to the convex area T along the first direction X, and a second non-display area NDA2 which extends along the second direction Y and is located between the convex area T and the concave area 3; and the second display area DA2 has a second edge E2 parallel to the first edge E, and the third non-display area NDA3 is located between the second edge E2 and the concave area 3. It should be noted that in the present disclosure the fan-out area refers to an area where the plurality of lead wires 5 is located. It should be also noted that in FIG. 2, the driving chip 33 is arranged on a flexible printed circuit board 32 and the flexible printed circuit board is electrically connected to the lead wires of the reflexed area, however, the driving chip can be directly arranged in the reflexed area to be electrically connected to the lead wires in some other embodiments.

According to an embodiment shown as FIG. 4, the driving chip 33 includes pins Y arranged in an array formed in the first direction X and the second direction Y, the second lead wires 52 are electrically connected to the pins Y1 away from the first edge F, and the first lead wires 51 are electrically connected to the pins Y2 close to the first edge E. Since the first lead wires need a long distance to got electrically connected to the driving chip 33 located in the reflexed area 31 while the second lead wires 52 can be electrically connected to the driving chip 33 without a long distance as the first lead wires 51, the first lead wires 51 have a big voltage drop, and the arrangement that the second lead wires 52 are electrically connected to the pins Y1 away from the first edge E and the first lead wires 51 are electrically connected to the pins Y2 close to the first edge E can effectively balance the resistance difference between the first lead wires 51 and the second lead wires 52, thereby improving signal transmission homogeneity and display quality. It should be noted that expressions such as "away from" and "close to" in the present disclosure all refer to a case in which the reflexed area has not been bent to the back surface of the flexible display panel.

Figure 5:
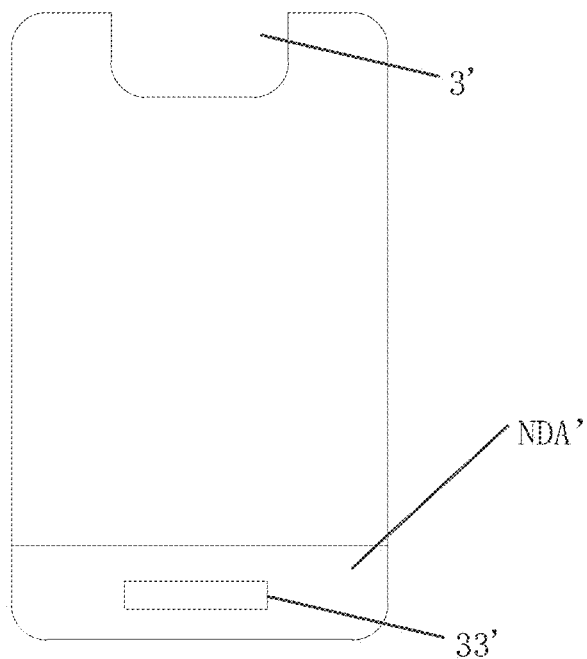
FIG. 5 shows a comparison example of a flexible display panel according to an embodiment of the present disclosure.
Figure 6:
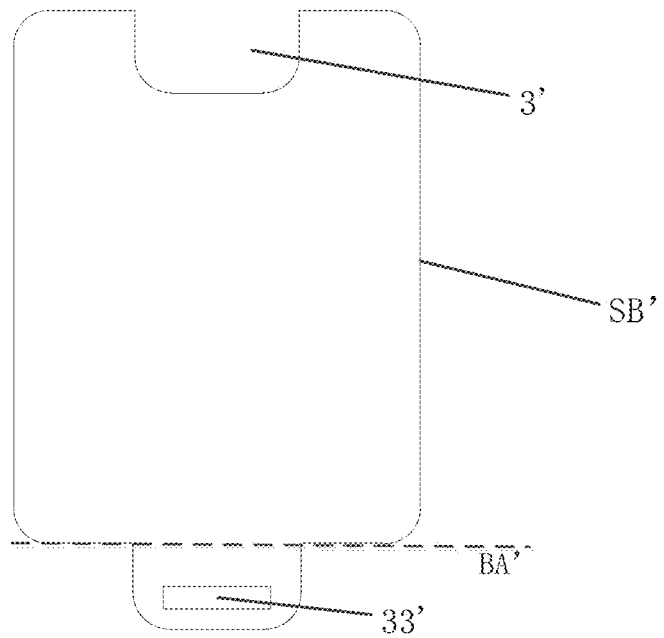
FIG. 6 shows a comparison example of another flexible display panel according to an embodiment of the present disclosure.

FIG. 5 shows a comparison example of a flexible display panel according to an embodiment of the present disclosure, and FIG. 6 shows a comparison example of another flexible display panel according to an embodiment of the present disclosure. In the flexible display panel shown in FIG. 5, a driving chip 33' is arranged in a part of the non-display area NDA' opposite to an area 3' and the driving chip 33' occupies a large border area, which is detrimental to display with a narrow border. In FIG. 6, a flexible substrate SB' is adopted, a driving chip 33' is arranged opposite to the area 3', and then the flexible substrate is bent about a folding axis BA', such that the driving chip 33' is located on a back surface of the flexible substrate and thus the flexible display panel has a small border when observed. However, since a part of the flexible substrate SB' at two sides of the driving chip 33' needs to be removed from the flexible display panel, this would waste the part of the flexible substrate SB' and reduce an integration degree of the flexible display panel, causing a big waste in materials and production capability. In contrast, according to the embodiments of the present disclosure, the driving chip is arranged in the reflexed area 31, the signal traces 4 are electrically connected to the driving chip 33 in the reflexed area by the fan-out area, and then the reflexed area is bent about the folding axis to the back surface of the flexible display panel 100. In this way, the flexible substrate can be sufficiently used, thereby improving utilization of the flexible substrate and achieving a narrow border.

Figure 7:
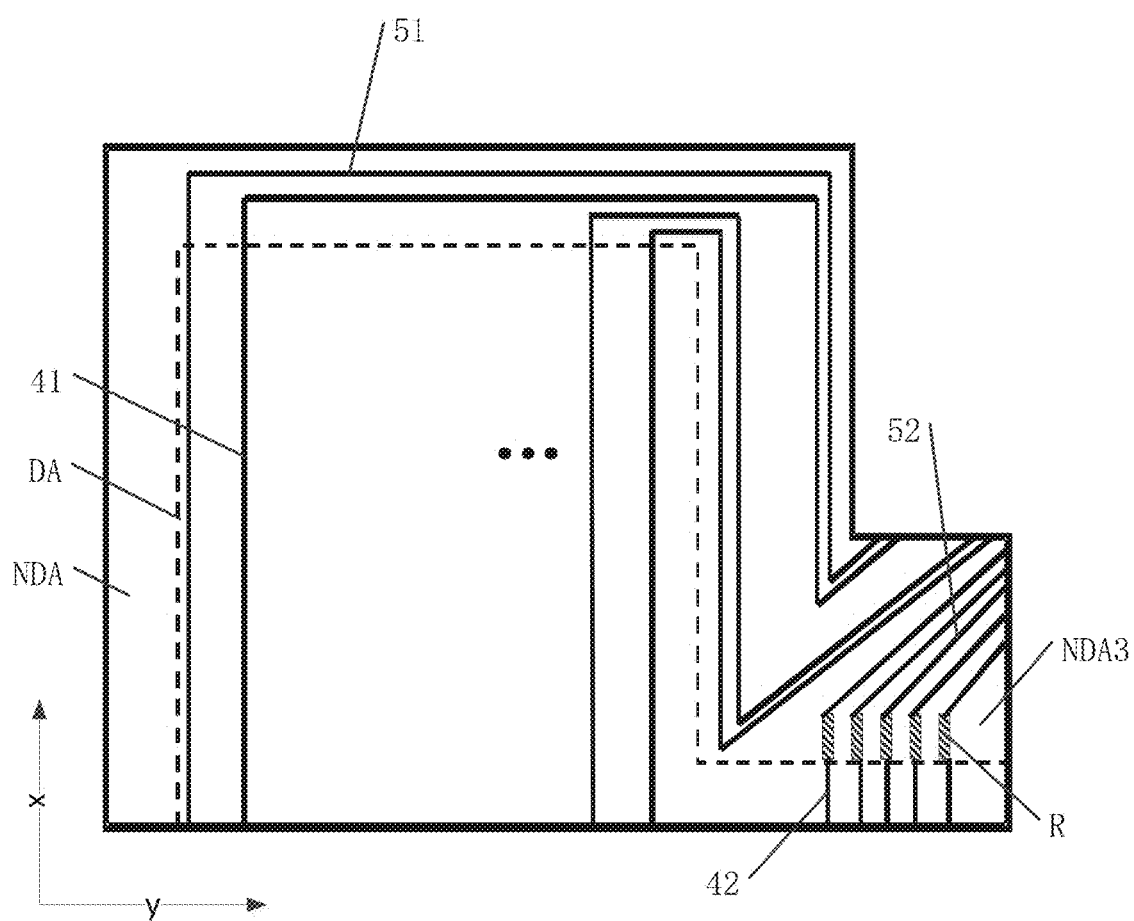
FIG. 7 is a schematic diagram showing a local planar structure of another flexible display panel according to an embodiment of the present disclosure.

FIG. 7 is a schematic diagram showing a local planar structure of another flexible display panel according to an embodiment of the present disclosure. The embodiment shown in FIG. 7 differs from the above embodiments in that there are compensation resistors R provided in the third non-display area NDA3 and the second signal traces 42 are electrically connected to the second lead wires 52 by the compensation resistors R. Since the first lead wires 41 need a long distance to get electrically connected to the driving chip 33 located in the reflexed area 31 while the second lead wires 42 can be electrically connected to the driving chip 33 without such long distance as the first lead wires 41, when the compensation resistors R are provided in the third non-display area NDA3, the second signal traces 42 are electrically connected to the second lead wires 52 by the compensation resistors R. This can further facilitate regulation of resistances of the compensation resistors, such that the voltage drops over the first lead wires and the second lead wires can be uniform, thereby improving the signal transmission homogeneity and the display quality. Since lengths of the second lead wires 52 become smaller from the edge of the third non-display area NDA3 to a center of the third non-display area NDA3 along the second direction Y, the resistance difference of the lead wires can be further reduced by increasing lengths of the compensation resistors R in the direction from the edge to the center. Regulation of the lengths of the compensation resistors R will not additionally occupy a width, such that adjacent lead wires 5 can have a reliable distance therebetween and a short circuit would not occur between the adjacent lead wires, thereby reducing a parasite capacitance between adjacent lead wires and improving the display effect.

Figure 8:
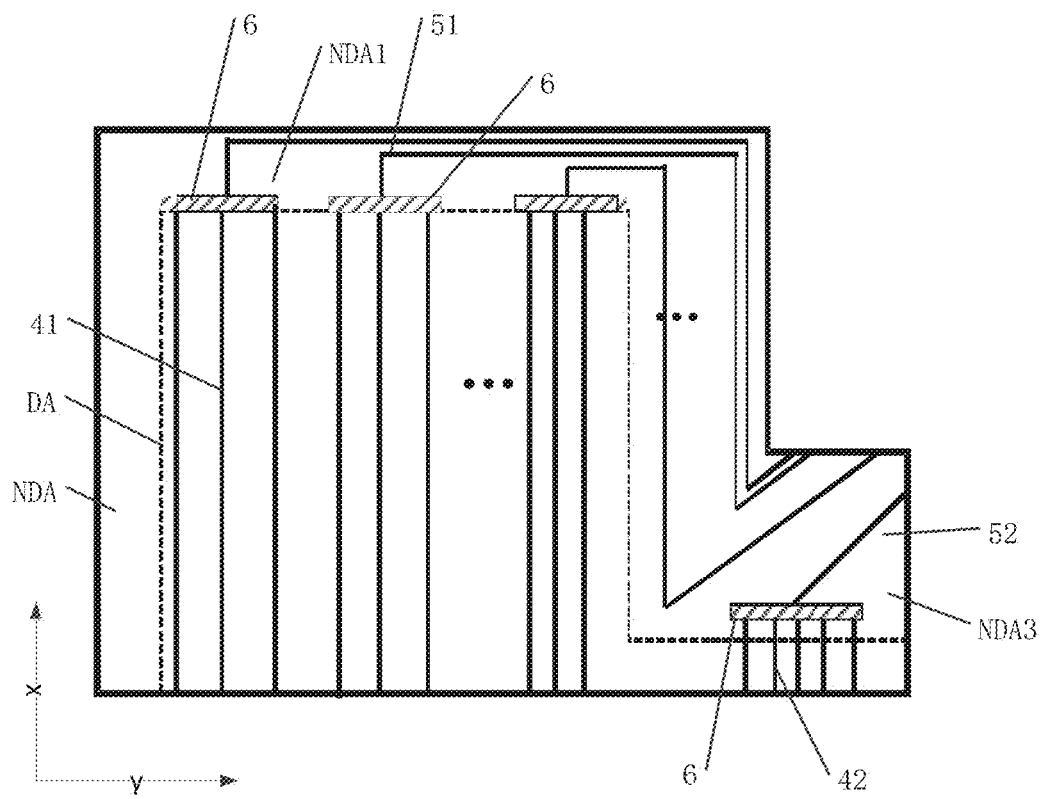
FIG. 8 is a schematic diagram showing a local planar structure of still another flexible display panel according to an embodiment of the present disclosure.
Figure 9:
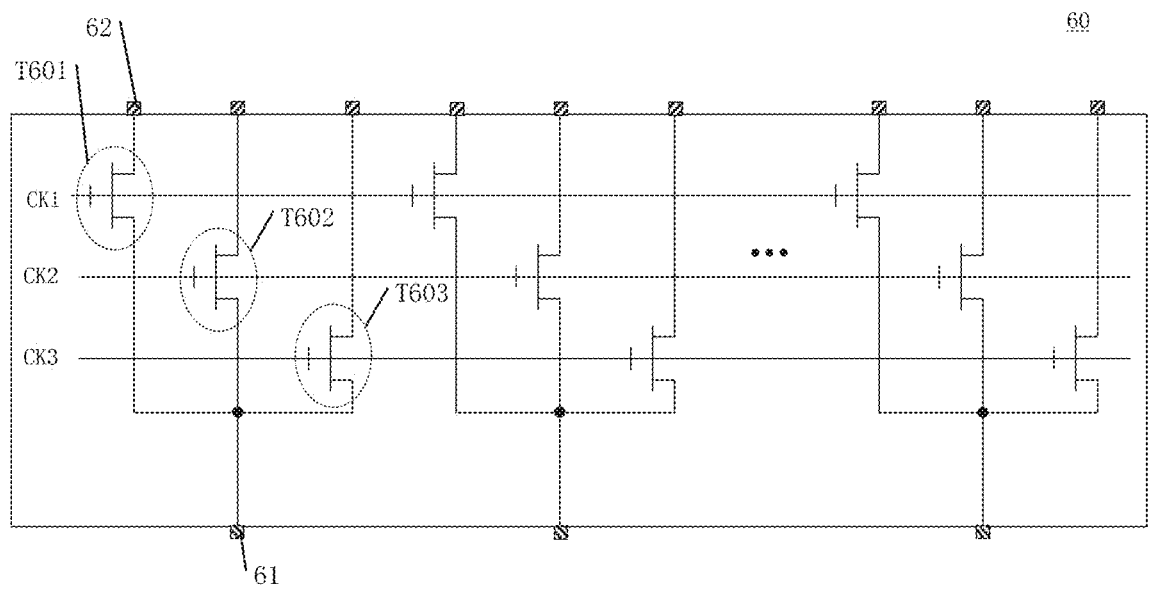
FIG. 9 is a schematic diagram of a circuit structure of a multiplexer according to an embodiment of the present disclosure.

FIG. 8 is a schematic diagram showing a local planar structure of still another flexible display panel according to an embodiment of the present disclosure, and FIG. 9 is a schematic diagram of a circuit structure of a multiplexer according to an embodiment of the present disclosure. The embodiment shown in FIG. 8 and FIG. 9 differs from the above embodiments in that there is a multiplexer 6 provided in the non-display area NDA. The multiplexer 6 includes M input terminals 61 and N output terminals 62, the signal traces 4 are electrically connected to the output terminals 62, the input terminals 61 are electrically connected to the lead wires 5, both M and N are positive integers and N>M. According to an embodiment, the multiplexer 6 is arranged in the first non-display area NDA1, the first signal traces 41 are electrically connected to the output terminals 62 of the multiplexer 6, and the first lead wires 51 are electrically connected to the input terminals 61 of the multiplexer 6. The multiplexer 6 further includes a first switch T601, a second switch T602, a third switch T603, a first control line CK1, a second control line CK2, and a third control line CK3. The first control line CK1 is used to control the first switch T601, the second control line CK2 is used to control the second switch T602, and the third control line CK3 is used to control the third switch T603. In the multiplexer 6 shown in FIG. 9, M:N=1:3, and in some other embodiments, M:N can be 1:4, 1:5, or 1:6, etc., which is not limited in the present disclosure. It can be understood that FIG. 9 is merely an example of the circuit structure of the multiplexer, but is not intended to constitute any limitation to the present disclosure.

In the present embodiment, since the non-display area NDA is provided with the multiplexer 6 therein and M<N, the number of the lead wires 5 can be smaller than the number of the signal traces 4, such that the number of the lead wires 5 in the fan-out area can be reduced, thereby reducing an area of the fan-out area and further narrowing the border of the flexible display panel.

According to another embodiment, the first non-display area NDA1 is provided with the multiplexer 6 therein, the first signal traces 41 are electrically connected to output terminals 62 of the multiplexer 6, and the first lead wires 51 are electrically connected to input terminals 61 of the multiplexer 6. Since the lead wires of the first non-display area NDA1 need to sequentially pass through the first non-display area NDA1, the second non-display area NDA2 and the third non-display area NDA3 to get electrically connected to the driving chip 33 located in the reflexed area 31, when the first non-display area. NDA1 is provided with the multiplexer 6 therein, the number of the lead wires in the first non-display area NDA1, in the second non-display area NDA2 and in the third non-display area NDA3 can be effectively reduced, thereby reducing an area a part of the non-display area occupied by the lead wires and achieving a narrow border.

According to another embodiment, the multiplexer 6 is provided in the third non-display area NDA3, the second signal traces 42 are electrically connected to output terminals 62 of the multiplexer 6, and the second lead wire 52 are electrically connected to input terminals 61 of the multiplexer 6. Since the concave area 3 is close to the third non-display area NDA3, when the third non-display area NDA3 is provided with the multiplexer therein, the number of the lead wires 5 in the third non-display area can be effectively reduced, thereby reducing the width of the concave area. This can reduce the area of the concave area 3 as much as possible to achieve the full-screen display, provided that components such as a camera or a sound box are placed in the concave area.

Figure 10:
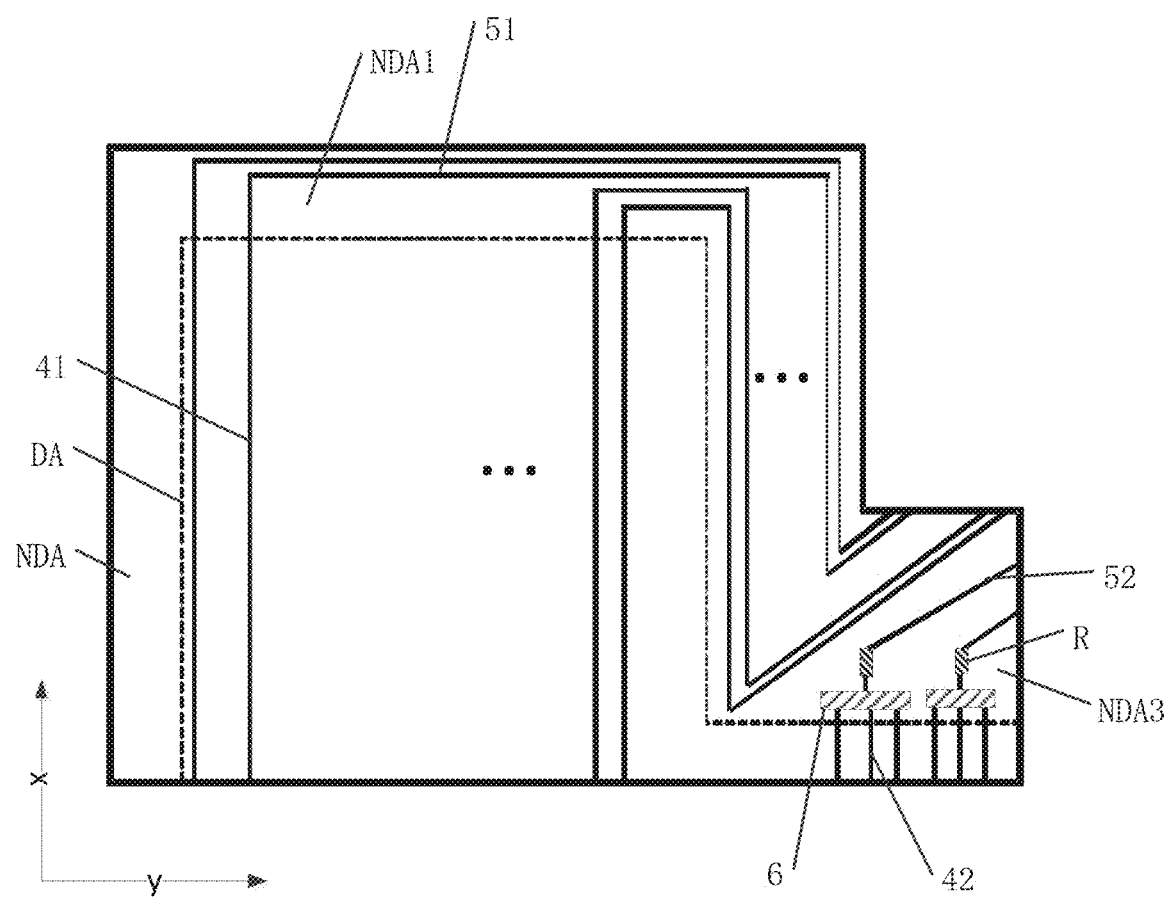
FIG. 10 is a schematic diagram showing a local planar structure of another flexible display panel according to an embodiment of the present disclosure.

FIG. 10 is a schematic diagram showing a local planar structure of still another flexible display panel according to an embodiment of the present disclosure. The embodiment shown in FIG. 10 differs from the above embodiment in that the third non-display area NDA3 is provided with compensation resistors R, the second signal traces 42 are electrically connected to the output 62 of the multiplexer 6, and the compensation resistors R are electrically connected to the input terminals 61 of the multiplexer 6, such that both the number of the lead wires and the number of the compensation resistors R can be reduced to achieve a narrow border, and the uniformity of the resistances of the lead wires 5 can also be regulated to improve the signal transmission homogeneity and the display quality.

It should be noted that the multiplexer 6 can be arranged in at least one of the first non-display area NDA1, the second non-display area NDA2, or the third non-display area NDA3, which can be freely selected according to actual needs and is not particularly limited in the present disclosure. It should also be noted that the fan-out area in the above embodiment can includes the first non-display area NDA1, the second non-display area NDA2, and the third non-display area NDA3.

Figure 11:
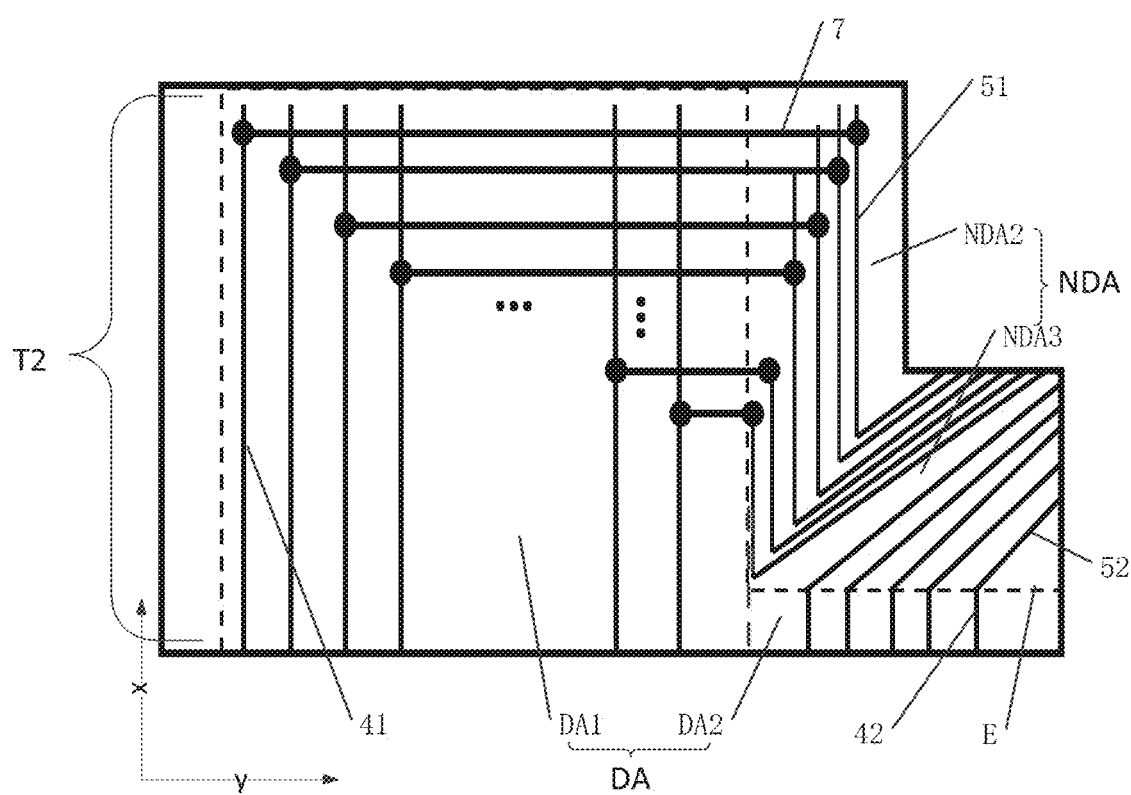
FIG. 11 is a schematic diagram showing a local planar structure of still another flexible display panel according to an embodiment of the present disclosure.

FIG. 11 is a schematic diagram showing a local planar structure of still another flexible display panel according to an embodiment of the present disclosure. The flexible display panel provided by the embodiment shown in FIG. 11 is divided into a display area DA and a non-display area NDA. The display area DA includes a first display area DA1 and a second display area DA2, the first display area DA1 includes a convex area T2, and the second display area DA2 does not include the convex area T2 and is adjacent to the first edge E. There are first signal traces 41 provided in the first display area DA1, and there are first lead wires 51 electrically connected to the first signal traces 41 provided in a fan-out area. There are second signal traces 42 provided in the second display area DA2, and there are second lead wires 52 electrically connected to the second signal traces 42 provided in the fan-out area. The non-display area includes: a second non-display area NDA2 which extends along the second direction y and is located between the convex area T2 and the concave area 3; and a third non-display area NDA3 located between the first edge E and the concave area 3. The flexible display panel further includes at least one connecting line 7 located in a different layer from a layer where the signal traces 4 are located. The at least one connecting line 7 extends from the display area DA to the second non-display area NDA2, at least one of the first signal traces 41 is electrically connected to the lead wire 5 by the connecting line 7. Therefore, at least a part of the first lead wires 51 located in the display area DA can be electrically connected to the lead wire 52 in the second non-display area NDA2 by the connecting line 7, and when there are a large number of signal traces 4 provided in the convex area T2, the difficulty caused by too many associated lead wires 5 can be avoided. Besides, a part of the signal traces 4 is electrically connected to the lead wires 4 by the connecting line 7, which can reduce the width of the non-display area NDA, facilitate narrowing the border of the flexible display panel, and improve the display quality.

In some other embodiments, all of the first signal traces 41 can be electrically connected to the first lead wires 5 by the connecting line 7. Thus, the first signal traces 41 of the first display area DA1 pass through the second non-display area NDA2 and the third non-display area NDA3 to get electrically connected to the driving chip 33, such that there is no need to provide an additional border at the end of the first display area DA1 (i.e., the first non-display area is unnecessary) for use in wiring of the first lead wires 51, thereby increasing the area of the display area and achieving a narrower border.

Figure 12:
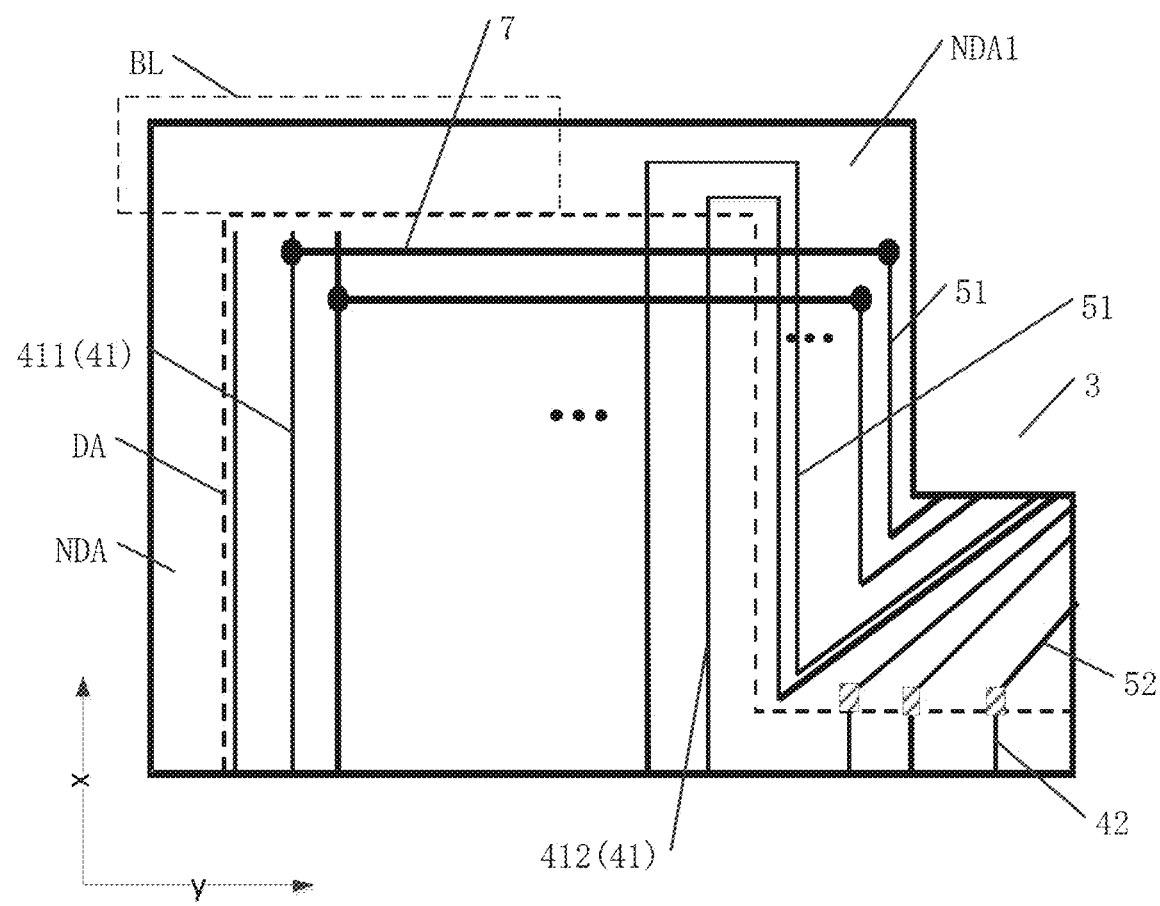
FIG. 12 is a schematic diagram showing a local planar structure of still another flexible display panel according to an embodiment of the present disclosure.

FIG. 12 is a schematic diagram showing a local planar structure of still another flexible display panel according to an embodiment of the present disclosure. The embodiment shown in FIG. 12 differs from the above embodiment in that the non-display area NDA includes a first non-display area NDA1 which is adjacent to the convex area T2 along the first direction x, the first signal traces 41 includes a first signal trace group 411 and a second signal trace group 412, the first signal trace group 411 is far away from the concave area 3, and the second signal trace group 412 is close to the concave area 3; signal traces 4 in the first signal trace group 411 are electrically connected to the first lead wires 51 by connecting lines 7; and signal traces 4 in the second signal trace group 412 are electrically connected to the first lead wires 51 directly. In the present embodiment, the second signal trace group 412 is not provided with corresponding connecting lines 7, but is electrically connected to the first lead wires 51 directly. Therefore, when there are a large number of signal traces 4 provided in the convex area T2 and the length of the convex area T2 along the first direction x is limited, such arrangement can avoid the difficulty in arrangement of too many corresponding connecting lines 7, thereby avoiding influence on an original structure of the convex area T2. The connecting lines 7 extend along the second direction y such that the connecting lines 7 can be connected to the first lead wires 51 with smallest lengths of the connecting lines 7, thereby avoiding a large overlapping area between the connecting lines 7 and other film layers, which would otherwise cause a large parasite capacitance. In an embodiment, the first non-display area NDA1 can have a blank area BL in which no first lead wire 51 is arranged. For example, when the first signal trace group 411 includes adjacent signal traces 41, the blank area BL of the first non-display area NDA1 is not provided with any wiring, and the blank area BL is located at an edge or a corner of the flexible display panel. In an another embodiment, in the blank area BL, an electronic element (not shown in the figures) can be provided, the remaining wirings or circuits of the flexible display panel can be provided, which is not limited in the present disclosure. In the present embodiment, since the edge or corner of the flexible display panel where the blank area BL is located may be fragile and no lead wire is provided in the blank area BL, this can avoid reliability reduction of the flexible display panel due to collision or folding of the edge or the corner, which would otherwise impact the signal transmission.

In some embodiments, the blank area BL can be located in the display area, for displaying date and time, etc., which is not limited in the present disclosure.

In another embodiment, compensation resistors R can be provided in the third non-display area NDA3, and the second signal traces 42 can be electrically connected to the second lead wires 52 by the compensation resistors R. In this embodiment, the resistance difference between the first signal trace group and the second signal trace group 412 can be effectively reduced by the electrical connection between signal traces of the first signal trace group 411 and the first lead wires 51 by the connecting lines, such that the resistance difference between the first signal traces 41 can be small, and when the compensation resistors R are provided in the third non-display area NDA3, the resistance difference between the second signal traces 42 and the first signal traces 41 can be further reduced, thereby improving signal homogeneity and display effect.

Figure 13:
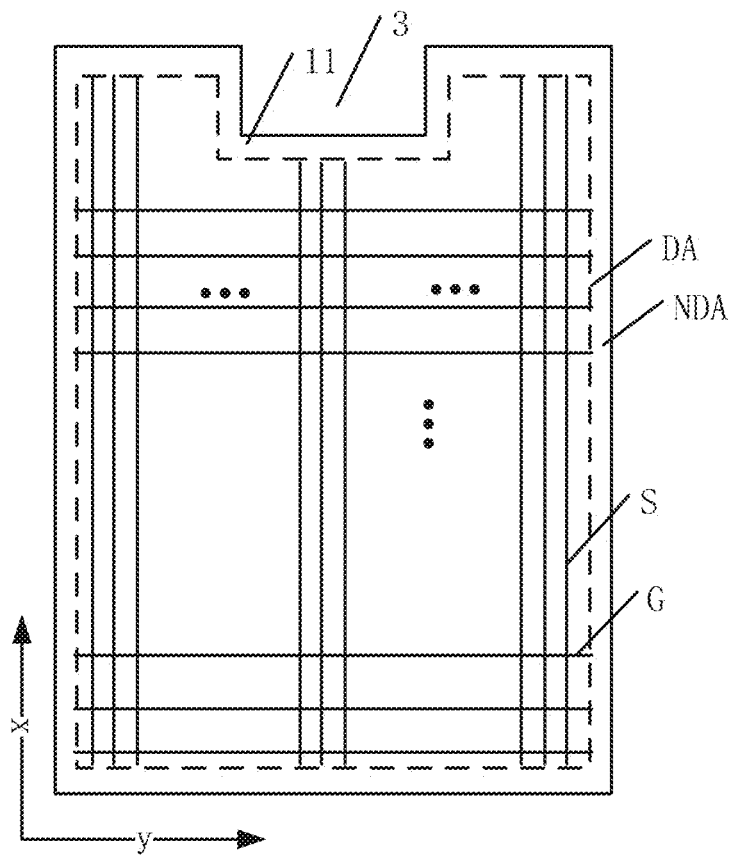
FIG. 13 is a schematic diagram showing a planar structure of another flexible display panel according to an embodiment of the present disclosure.
Figure 14:
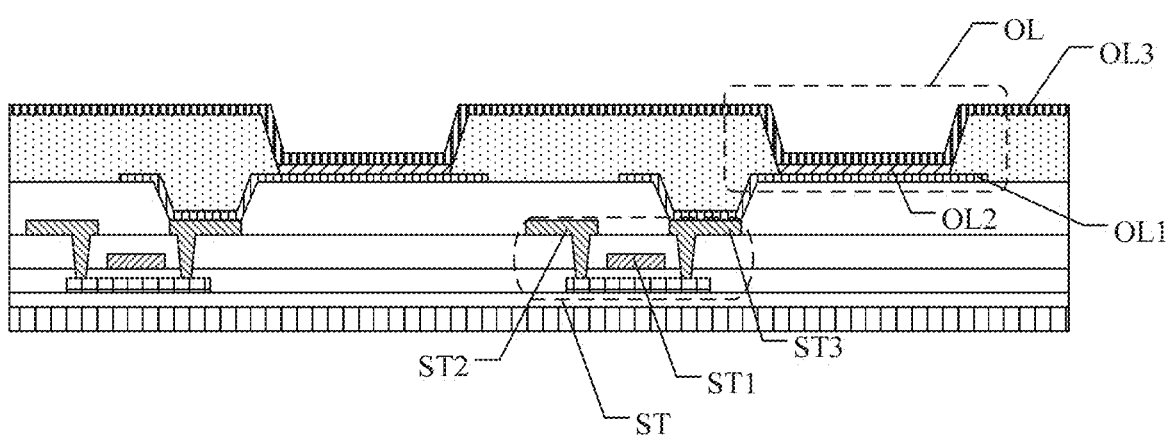
FIG. 14 is a schematic diagram showing a local cross section of a flexible display panel according to an embodiment of the present disclosure.

FIG. 13 is a schematic diagram showing a planar structure of another flexible display panel according to an embodiment of the present disclosure, and FIG. 14 is a schematic diagram showing a local cross section of a flexible display panel according to an embodiment of the present disclosure. As shown in FIGS. 13 and 14, the flexible display panel can be an organic light-emitting display panel. Particularly, there are organic light-emitting diodes OL provided in the display area DA and each of the plurality of organic light-emitting diode OL includes an anode OL1, a light-emitting material portion OL2 and a cathode OL3. The connecting lines 7 and the anode OL1 are made of a same material and are formed in a same layer. In some embodiments, the flexible display panel further includes thin film transistors ST and the plurality of thin film transistors ST is electrically connected to the plurality of organic light-emitting diodes OL. In some embodiments, the flexible display panel further includes gate lines G and data lines 5, the plurality of gate lines G are arranged in a same layer as gate electrodes ST1 of the plurality of thin film transistors ST, the plurality of data lines S and source electrodes ST2 and drain electrodes ST3 of the plurality of thin film transistors ST are arranged in a same layer. The signal traces 4 can be the gate lines G and/or the data line S, and the signal traces 4 are arranged in a different layer from the layer where the connecting lines 7 are arranged. The anode OL1 is generally made of a material having good conductivity, and the signal traces 4 are made of the same material as the anode OL1 and thus can also have good conductivity. For example, the material of the anode OL1 can include Indium tin oxide (ITO) and/or silver. In addition, the film layer where the anode OL1 is located has a simple structure, e.g., generally, the film layer where the anode OL1 is located is not provided with any other components except the anode OL1 in the display area DA. In the present embodiment, the connecting lines 7 and the anode OL1 are made of the same material and are arranged in the same layer, such that the arrangement of the connecting line 7 is simple. Besides, during the manufacturing process of the organic light-emitting display panel of the present embodiment, the anode OL1 and the connecting lines 7 can be simultaneously formed in a same conductive layer by patterning in a same process, and therefore, there is no need to add an additional process or additional material to form the connecting lines 7, which is beneficial for improving production efficiency and reducing production cost of the organic light-emitting display panel. Further, since the anode OL1 and the connecting lines 7 are formed in the same layer, there is no need to add an additional film layer, which is beneficial for thinning and lightening of the flexible display panel.

Figure 15:
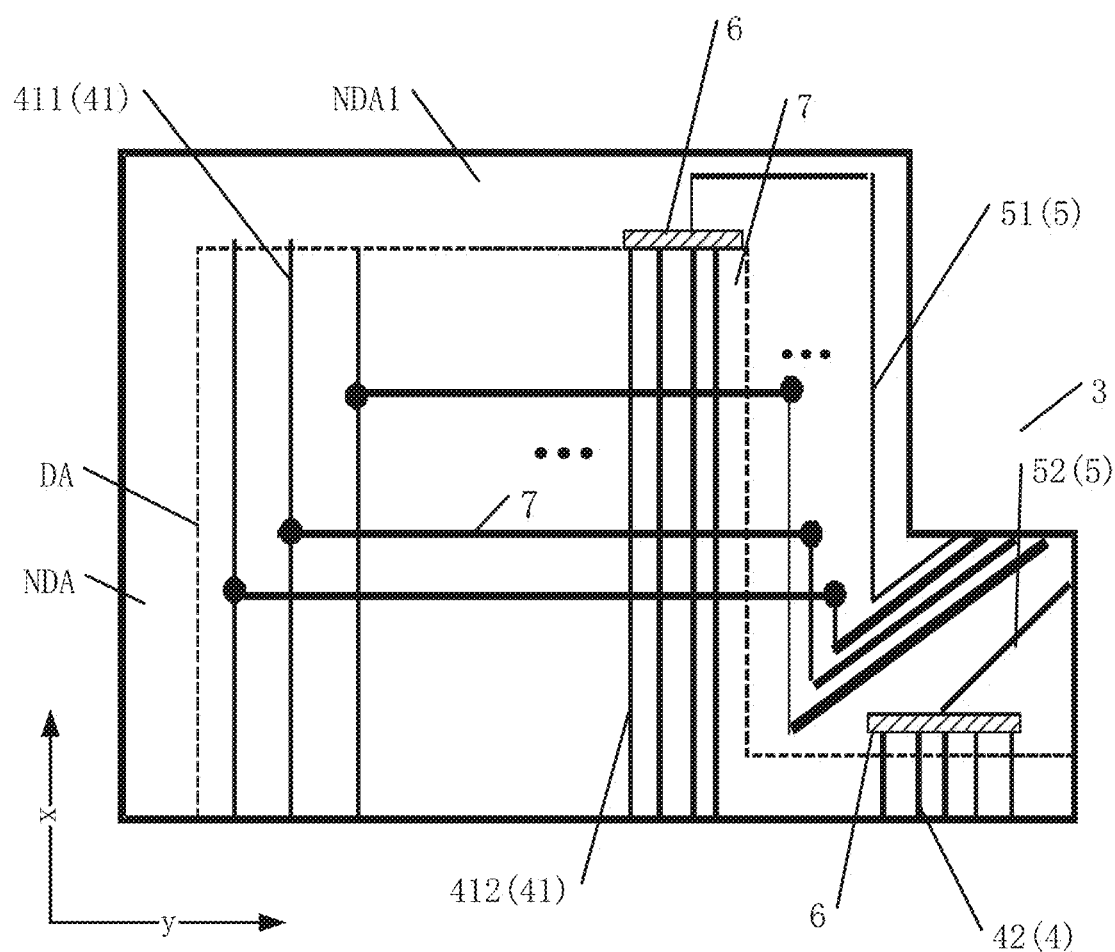
FIG. 15 is a schematic diagram showing a local planar structure of still another flexible display panel according to an embodiment of the present disclosure.

FIG. 15 is a schematic diagram showing a local planar structure of still another flexible display panel according to an embodiment of the present disclosure. With reference to FIG. 15 and FIG. 9, this embodiment differs from the above embodiment in that there is a multiplexer 6 provided in the non-display area NDA, the multiplexer 6 includes M input terminals and N output terminals, at least a part of the signal traces 4 is electrically connected to the output terminals, and the input terminals are electrically connected to the lead wires 5, where both M and N are positive integers and N>M.

According to a further embodiment, the flexible display panel includes a first non-display area NDA1 which is adjacent to the convex area T2 along the first direction X. There is a multiplexer 6 provided in the first non-display area. NDA1. At least a part of the first signal traces 41 is electrically connected to output terminals of the multiplexer 6, and the first lead wires 51 are electrically connected to the input terminals of the multiplexer 6. In an example, first signal traces 41 in the first signal trace group 411 are electrically connected to the output terminals of the multiplexer 6, the first signal trace group 411 is electrically connected to the first lead wires 51 in the second non-display area NDA2 by the connecting lines 7, such that the first non-display area NDA1 can have a blank area BL at an corner in which short traces resulted from collision or bending can be placed, thereby improving reliability of the flexible display panel. Moreover, this can reduce wiring load on the convex area, reduce an overlapping area between the connecting lines 7 and other films layers, then reduce parasite capacitance, and reduce a resistance difference between the first signal trace group 411 and the second signal trace group 412, thereby improving the signal transmission homogeneity and the display effect.

Figure 16:
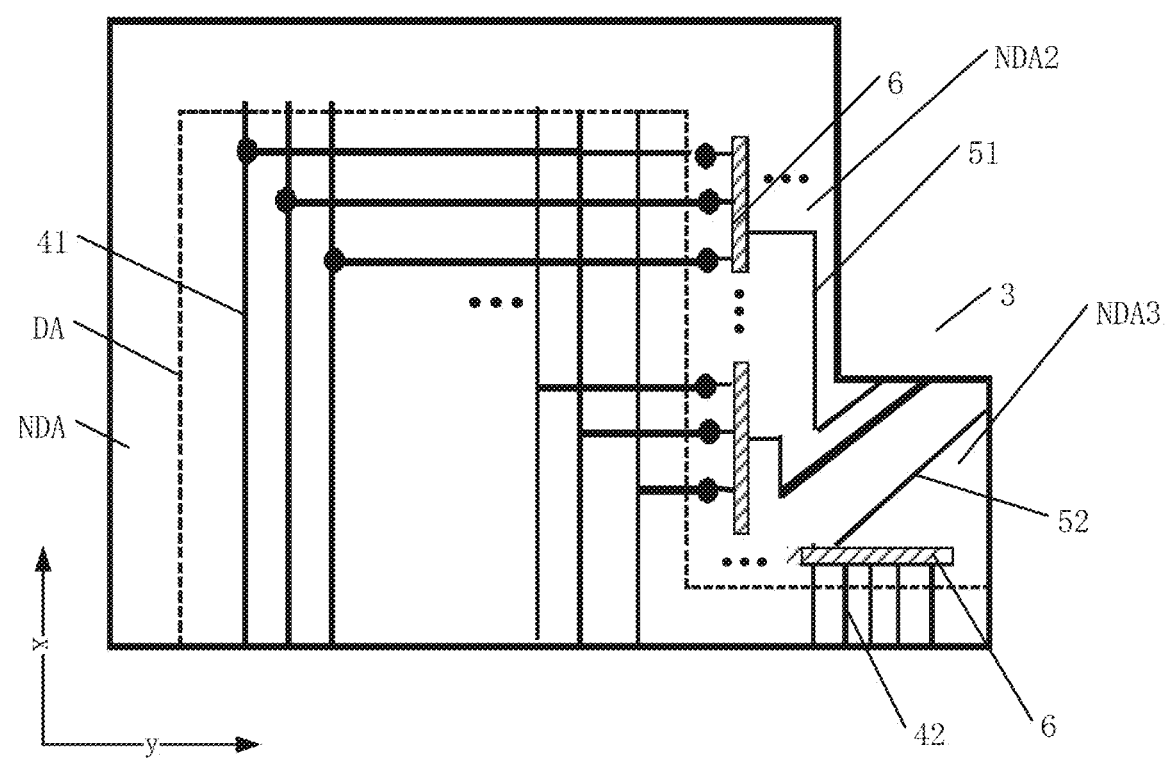
FIG. 16 is a schematic diagram showing a local planar structure of still another flexible display panel according to an embodiment of the present disclosure.

FIG. 16 is a schematic diagram showing a local planar structure of still another flexible display panel according to an embodiment of the present disclosure. The embodiment shown in FIG. 16 differs from the above embodiments in that all of the first signal traces 41 are electrically connected to the first lead wires 51 by the connecting lines 7, there is a multiplexer 6 provided in the second non-display area NDA2 the connecting lines 7 are electrically connected to output terminals of the multiplexer 6, and the first lead wires 51 are electrically connected to input terminals of the multiplexer 6. In the present embodiment, the first non-display area can be not present, the convex area as a whole can be a part of the display area, and the second non-display area can be provided with the multiplexer therein, such that the number of the first lead wires in the second non-display area can be reduced, thereby reducing the area of the second non-display area and achieving a narrow border.

According to a further embodiment, as shown in FIG. 16, the multiplexer 6 can be provided in the third non-display area NDA3, the signal traces can be electrically connected to output terminals of the multiplexer 6, and input terminals of the multiplexer 6 can be electrically connected to the lead wires. The arrangement of the multiplexer 6 in the third non-display area NDA3 can reduce an area of the third non-display area, which can further narrow the border or reduce a width of the concave area.

Figure 17:
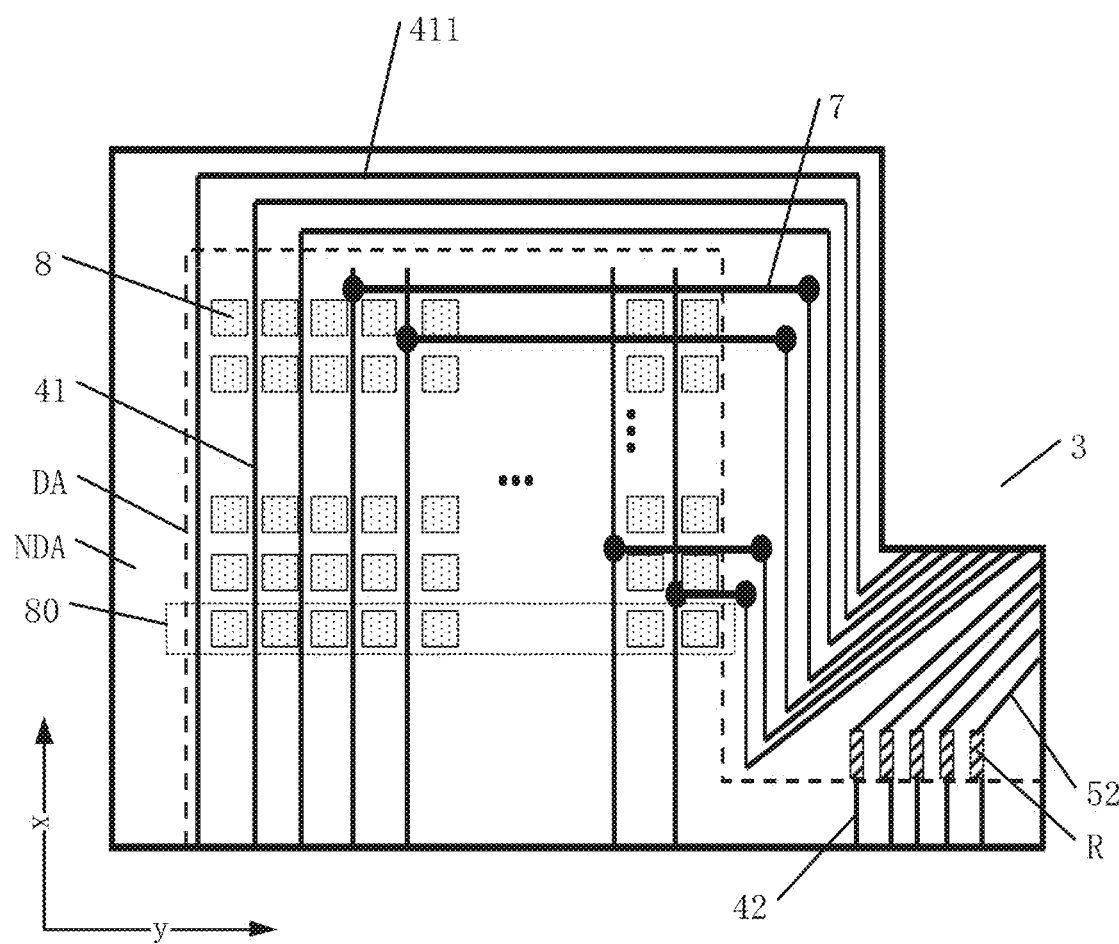
FIG. 17 is a schematic diagram showing a local planar structure of still another flexible display panel according to an embodiment of the present disclosure.

FIG. 17 is a schematic diagram showing a local planar structure of still another flexible display panel according to an embodiment of the present disclosure. As shown in FIG. 17, there is pixels 8 provided in the display area DA, and pixels located in a same row along the second direction y constitute a row of pixels. Each of the connecting lines 7 is located in an area between two adjacent rows of pixels 80. In the present embodiment, each of the connecting lines 7 is wired through the area between two adjacent rows of pixels 80 such that the area between rows of pixels 80 can be sufficiently used and then there is no need to provide an additional area for the arrangement of the connecting lines 7, which can improve an aperture ratio of the flexible display panel and improve display quality. It should be noted that the connecting lines can be straight lines or folding lines, and can be set according to an arrangement manner of the pixels, which is not limited in the present disclosure.

Figure 18:
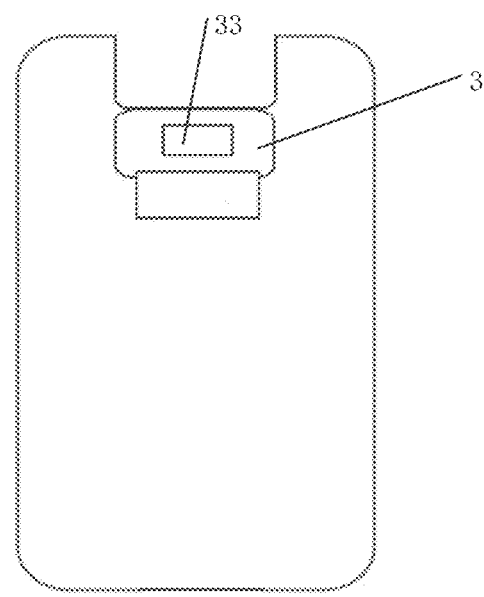
FIG. 18 is another rear view of the flexible display panel provided in FIG. 1.

FIG. 18 is another rear view of the flexible display panel provided in FIG. 1. As shown in FIG. 18, the flexible display panel further includes a touch layer or a fingerprint identification mechanism. The touch layer can impart a touch function, and the signal traces can include touch signal traces and/or fingerprint identification signal traces. In some other embodiments, the driving chip arranged in the reflexed area can be a touch driving chip which provides a touch signal to the touch layer or a fingerprint identification driving chip.

It should be noted that in the embodiment shown in FIG. 2, the lead wires are electrically connected to the flexible printed circuit board and the driving chip is arranged on the flexible printed circuit board, such that the wiring load of the concave area can be shared by the flexible printed circuit board, and then the area of the concave area can be further reduced. In some other embodiments, the driving chip can be directly arranged in the reflexed area and the lead wires are electrically connected to the driving chip in the reflexed area, which is not limited in the present disclosure.

Figure 19:
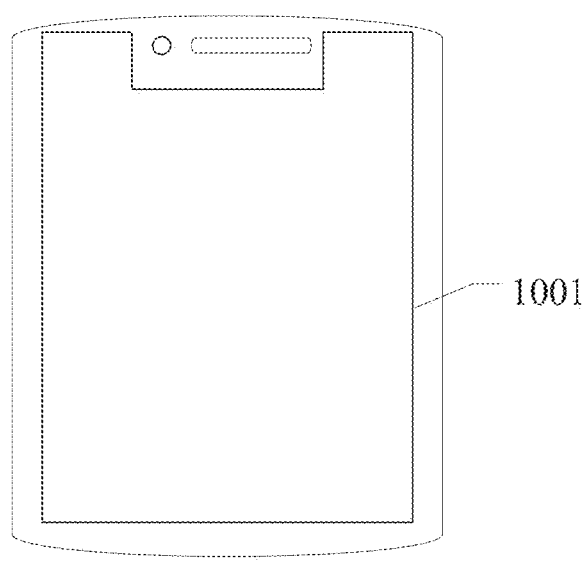
FIG. 19 is a schematic diagram showing a structure of a flexible display device according to an embodiment of the present disclosure.

The present disclosure further provides a flexible display device which includes the flexible display panel according to the embodiments of the present disclosure. FIG. 19 is a schematic diagram showing a structure of a flexible display device according to an embodiment of the present disclosure. The flexible display device 1000 as shown in FIG. 19 includes a flexible display panel 1001 according to any of the above embodiments of the present disclosure. FIG. 19 merely shows a cell phone for illustrating the display device 1000. It can be understood that the flexible display device provided by the present disclosure can be any display device having a display function, for example, a computer, a TV set, an on-board display device, etc., which is not limited by the present disclosure. The flexible display device provided by the present disclosure has the beneficial effect of the flexible display panel of the embodiment of present disclosure, which can be referred to from the description about the flexible display panel in the above embodiments, and will not be repeated herein.

What is claimed is:

1. A flexible display panel, wherein the flexible display panel is divided into a display area and a non-display area surrounding the display area, and the non-display area includes a fan-out area, and the flexible display panel comprises:
   a plurality of signal traces provided in the display area, the plurality of signal traces extending along a first direction;
   a first edge concaving toward an interior of the display area to form, on the flexible display panel, at least one concave area and at least one convex area adjacent to the at least one concave area, wherein the at least one convex area protrudes along a direction away from the interior of the display area, the at least one convex area and the at least one concave area are arranged along a second direction, and the second direction intersects the first direction;
   a reflexed area, the reflexed area having a folding axis parallel to the first edge;
   a plurality of lead wires provided in the fan-out area, wherein each lead wire of the plurality of lead wires comprises a first end and a second end, and the plurality of signal traces is electrically connected to the first ends of the plurality of lead wires; and a driving chip arranged in the reflexed area, wherein the driving chip is electrically connected to the second ends of the plurality of lead wires, and the driving chip is a ball grid array package driving chip,
   wherein the display area comprises a first display area and a second display area, the first display area comprises the at least one convex area, and the second display area does not comprise the at least one convex area and is adjacent to the first edge;
   wherein the plurality of signal traces comprises a plurality of first signal traces and a plurality of second signal traces, and the plurality of lead wires comprises a plurality of first lead wires and a plurality of second lead wires;
   wherein the plurality of first signal traces is provided in the first display area, and a plurality of first lead wires electrically connected to the plurality of first signal traces is provided in the fan-out area;
   wherein a plurality of second signal traces is provided in the second display area, and a plurality of second lead wires electrically connected to the plurality of second signal traces is provided in the fan-out area;
   wherein the non-display area comprises a second non-display area which extends along the second direction and is located between the least one convex area and the at least one concave area, and a third non-display area located between the first edge and the at least one concave area;
   wherein the flexible display panel further comprises at least one connecting line which is arranged in a layer different from a layer in which the plurality of signal traces is arranged, the at least one connecting line extends from the display area to the second non-display area, and at least one of the plurality of first signal traces is electrically connected to at least one of the plurality of lead wires by the at least one connecting line;
   wherein the plurality of first signal traces comprises a first signal trace group and a second signal trace group, the first signal trace group is away from the at least one concave area, and the second signal trace group is close to the at least one concave area; and
   wherein signal traces in the first signal trace group are electrically connected to the plurality of first lead wires by the at least one connecting line, and signal traces in the second signal trace group are electrically connected to the plurality of first lead wires directly.

2. The flexible display panel according to claim 1, wherein the display area comprises a first display area and a second display area, the first display area comprises a part of the display area located in the at least one convex area, and the second display area does not comprise the part of the display area located in the at least one convex area and is adjacent to the first edge;
   wherein a plurality of first signal traces is provided in the first display area, and a plurality of first lead wires electrically connected to the plurality of first signal traces is provided in the fan-out area;
   wherein a plurality of second signal traces is provided in the second display area, a second edge parallel to the first edge is provided in the second display area, and a plurality of second lead wires electrically connected to the plurality of second signal traces is provided in the fan-out area; and
   wherein the non-display area comprises a first non-display area which is adjacent to the at least one convex area along the first direction, a second non-display area which extends along the second direction and is located between the at least one convex area and the at least one concave area, and a third non-display area located between the second edge and the at least one concave area.

3. The flexible display panel according to claim 2,
wherein the plurality of first lead wires sequentially pass through the first non-display area, the second non-display area, and the third non-display area to be electrically connected to pins of the driving chip; and
wherein the plurality of second lead wires passes through the third non-display area to be electrically connected to the pins of the driving chip.

4. The flexible display panel according to claim 3,
wherein the pins of the driving chip are arranged in an array along the first direction and the second direction, the plurality of second lead wire is electrically connected to a part of the pins of the driving chip away from the first edge; and
wherein the plurality of first lead wire is electrically connected to a part of the pins of the driving chip close to the first edge.

5. The flexible display panel according to claim 2,
wherein a multiplexer is provided in the non-display area, and the multiplexer comprises M input terminals and N output terminals;
wherein the plurality of signal traces is electrically connected to the output terminals of the multiplexer, the plurality of lead wires is electrically connected to the input terminals of the multiplexer; and
wherein both M and N are positive integers, and N>M.

6. The flexible display panel according to claim 5,
wherein the multiplexer is provided in the first non-display area; and
wherein at least a part of the plurality of first signal traces is electrically connected to the output terminals of the multiplexer, and the plurality of first lead wires is electrically connected to the input terminals of the multiplexer.

7. The flexible display panel according to claim 5,
wherein the multiplexer is provided in the third non-display area; and
wherein the plurality of second signal traces is electrically connected to the output terminals of the multiplexer, and the plurality of second lead wires is electrically connected to the input terminals of the multiplexer.

8. The flexible display panel according to claim 2, wherein at least one of the plurality of second lead wires is electrically connected to a compensation resistor, and the compensation resistor is located in the third non-display area.

9. The flexible display panel according to claim 8, wherein the third non-display area comprises a central area and an edge area close to the first display area, and a length of the compensation resistor gradually increases along a direction from the edge area to the central area.

10. The flexible display panel according to claim 1,
wherein the flexible display panel comprises a plurality of gate lines and a plurality of data lines; and
wherein the plurality of signal traces comprises the plurality of gate lines or the plurality of data lines, or the plurality of signal traces comprises both the plurality of gate lines and the plurality of data lines.

11. The flexible display panel according to claim 10,
wherein a plurality of organic light-emitting diodes is provided in the display area, each of the plurality of organic light-emitting diodes comprises an anode, a light-emitting material layer, and a cathode; and
wherein the at least one connecting line and the anode are prepared in a same process.

12. The flexible display panel according to claim 1, wherein all of the plurality of first signal traces are electrically connected to the plurality of first lead wires by the at least one connecting line.

13. The flexible display panel according to claim 1,
wherein a multiplexer is provided in the non-display area, and the multiplexer comprises M input terminals and N output terminals;
wherein at least a part of the plurality of signal traces is electrically connected to the output terminals of the multiplexer, and the plurality of lead wires is electrically connected to the input terminals of the multiplexer; and
wherein both M and N are positive integers, and N>M.

14. The flexible display panel according to claim 13, wherein the non-display area further comprises a first non-display area which is adjacent to the at least one convex area along the first direction;
wherein the plurality of first signal traces comprises a first signal trace group and a second signal trace group, the first signal trace group is away from the at least one concave area, and the second signal trace group is close to the at least one concave area;
wherein signal traces in the first signal trace group are electrically connected to the plurality of first lead wires by the at least one connecting line; and
wherein the multiplexer is provided in the first non-display area, the signal traces in the second signal trace group are electrically connected to the output terminals of the multiplexer, and the plurality of first lead wires is electrically connected to the input terminals of the multiplexer.

15. The flexible display panel according to claim 13,
wherein all of the plurality of first signal traces are electrically connected to the plurality of first lead wires by the at least one connecting line; and
wherein the multiplexer is provided in the second non-display area, the at least one connecting lines is electrically connected to the output terminals of the multiplexer, and the plurality of first lead wires is electrically connected to the input terminals of the multiplexer.

16. The flexible display panel according to claim 13,
wherein the multiplexer is provided in the third non-display area; and
wherein the plurality of signal traces is electrically connected to the output terminals of the multiplexer, and the plurality of lead wires is electrically connected to the input terminals of the multiplexer.

17. The flexible display panel according to claim 1, wherein at least one of the plurality of second lead wires is electrically connected to a compensation resistor, and the compensation resistor is located in the third non-display area.

18. The flexible display panel according to claim 17, wherein the third non-display area comprises a central area and an edge area close to the first display area, and a length of the compensation resistor gradually increases along a direction from the edge area to the central area.

19. The flexible display panel according to claim 1, wherein a plurality of pixels is provided in the display area, pixels located in a same row along the second direction constitute a row of pixels; and wherein each of the at least one connecting line is located in an area between two adjacent rows of pixels.

20. A flexible display device, comprising:

a flexible display panel, wherein the flexible display panel is divided into a display area and a non-display area surrounding the display area, and the non-display area includes a fan-out area, and the flexible display panel comprises:

a plurality of signal traces provided in the display area, the plurality of signal traces extending along a first direction;

a first edge concaving toward an interior of the display area to form, on the flexible display panel, at least one concave area and at least one convex area adjacent to the at least one concave area, wherein the at least one convex area protrudes along a direction away from the interior of the display area, the at least one convex area and the at least one concave area are arranged along a second direction, and the second direction intersects the first direction;

a reflexed area, the reflexed area having a folding axis parallel to the first edge, the at least one convex area;

a plurality of lead wires provided in the fan-out area, wherein each lead wire of the plurality of lead wires comprises a first end and a second end, and the plurality of signal traces is electrically connected to the first ends of the plurality of lead wires; and a driving chip arranged in the reflexed area, wherein the driving chip is electrically connected to the second ends of the plurality of lead wires, and the driving chip is a ball grid array package driving chip, wherein the display area comprises a first display area and a second display area, the first display area comprises the at least one convex area, and the second display area does not comprise the at least one convex area and is adjacent to the first edge;

wherein the plurality of signal traces comprises a plurality of first signal traces and a plurality of second signal traces, and the plurality of lead wires comprises a plurality of first lead wires and a plurality of second lead wires;

wherein the plurality of first signal traces is provided in the first display area, and a plurality of first lead wires electrically connected to the plurality of first signal traces is provided in the fan-out area;

wherein a plurality of second signal traces is provided in the second display area, and a plurality of second lead wires electrically connected to the plurality of second signal traces is provided in the fan-out area;

wherein the non-display area comprises a second non-display area which extends along the second direction and is located between the least one convex area and the at least one concave area, and a third non-display area located between the first edge and the at least one concave area;

wherein the flexible display panel further comprises at least one connecting line which is arranged in a layer different from a layer in which the plurality of signal traces is arranged, the at least one connecting line extends from the display area to the second non-display area, and at least one of the plurality of first signal traces is electrically connected to at least one of the plurality of lead wires by the at least one connecting line;

wherein the plurality of first signal traces comprises a first signal trace group and a second signal trace group, the first signal trace group is away from the at least one concave area, and the second signal trace group is close to the at least one concave area; and wherein signal traces in the first signal trace group are electrically connected to the plurality of first lead wires by the at least one connecting line, and signal traces in the second signal trace group are electrically connected to the plurality of first lead wires directly.

* * * * *